United States Patent
Honda

(10) Patent No.: US 7,060,511 B2
(45) Date of Patent: Jun. 13, 2006

(54) EVALUATION METHOD OF A FIELD EFFECT TRANSISTOR

(75) Inventor: Tatsuya Honda, Isehara (JP)

(73) Assignee: Semiconductor Energy Labortory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/845,133

(22) Filed: May 14, 2004

(65) Prior Publication Data

US 2004/0227191 A1     Nov. 18, 2004

(51) Int. Cl.
*H01L 23/58* (2006.01)

(52) U.S. Cl. .......................... 438/11; 438/14; 438/15; 438/18

(58) Field of Classification Search ..................... None
See application file for complete search history.

(56) References Cited

OTHER PUBLICATIONS

Mitsumasa Koyanagi, "Submicron Device II, 4.4.3 Effective Channel Length and Series Resistance of LDD Structure," Jan. 30, 1988, p. 202, line 14—p. 208, line 12.

*Primary Examiner*—Fetsum Abraham
(74) *Attorney, Agent, or Firm*—Eric J. Robinson; Robinson Intellectual Property Law Office

(57) ABSTRACT

The present invention provides a method for estimating resistance value of an LDD region that works in an actual FET and forming an optimum LDD region. Therefore, the present invention provides an FET in which OFF (leakage) current is reduced and has superior switching characteristics. An equivalent circuit is assumed so as to estimate an external resistance value. The equivalent circuit is a circuit in which an external resistor is serially-connected to the drain side of a conventional FET. And the threshold voltage and the external drain voltage—drain current characteristics of the FET having an LDD structure are measured, and the result is applied to the equivalent circuit. Regarding an external drain voltage when drain current is saturated as an external saturation drain voltage, a saturation drain voltage in an imaginary FET taking off the external resistor from the estimating FET is obtained from the threshold voltage. The external resistance value is estimated from the external saturation drain voltage, the saturation drain current, and the saturation drain voltage.

6 Claims, 8 Drawing Sheets

By measuring Vg - Id characteristics, the Vth is estimated.

By measuring V - Id characteristics, the Vsat and Idsat are estimated.

The Vdsat is estimated from Vth, then Vdsat, Vsat and Idsat are substituted in the theoretical expression.

Estimating an external resistance value

By measuring Vg - Id characteristics, the Vth is estimated.

By measuring V - Id characteristics, the Vsat and Idsat are estimated.

The Vdsat is estimated from Vth, then Vdsat, Vsat and Idsat are substituted in the theoretical expression.

Estimating an external resistance value

Fig. 7

EVALUATION METHOD OF A FIELD EFFECT TRANSISTOR

BACKGROUND OF THE INVENTION

1. Field of the Invention

The present invention relates to an evaluation method of a characteristic parameter which is required in designing and manufacturing a field effect transistor. Specifically, the present invention relates to an evaluation method of an external resistance value of a field effect transistor having low concentration drain regions.

2. Description of the Related Art

A three-terminal element, referred generally to as a field effect transistor (FET), has a structure in which current is modulated to flow and controlled depending on an applied voltage to a terminal referred to as a gate electrode. The current path is referred to as a channel forming region, which is sandwiched between two impurity regions which are each referred to as a source region and a drain region. Among such FETs, a MOST (Metal Oxide Semiconductor Transistor), particularly a TFT (Thin Film Transistor), is employed widely as a main component of electronic devices such as a computer and a display.

Regarding application to an electronic device, a mode of using an FET as a switching element is employed widely. However, in this case, there is a problem that switching characteristics deteriorate as the amount of OFF (leakage) current of the FET increases. A so-called LDD (Lightly Doped Drain) structure having low concentration drain regions outside a channel forming region is generally employed as a method for suppressing the OFF (leakage) current. Optimization of the LDD resistance value and the length of the LDD region is required. In other words, optimization of LDD regions is important. It is effective for suppression of the OFF (leakage) current that the dopant density of the LDD region is reduced and the resistance value is increased. However, on the other hand, it leads to a problem that on-current or operating speed is reduced. Accordingly, in consideration of the advantages and the disadvantages, it is necessary to set an optimum LDD region. However, it is difficult to estimate a value of an external resistance (a resistance of the current path in the FET subtracting the resistance of the channel forming region) such as for an LDD region in a real FET.

Resistance values of drain, source and LDD regions can be controlled with the density or depth of one conductivity type impurity element such as boron or phosphorus and an activation method. A conventional FET structure, which has only a source region, a drain region and a channel forming region in an active layer, is well-researched and many appraisal methods are proposed. For example, a method for measuring a resistance value of a channel forming region and an external resistance value in a linear region is known. (For example, Reference 1: "submicron device II", written by Mitsumasa Koyanagi, published by Maruzen Co., Ltd., Jan. 30, 1988, pp. 202–208.).

According to this method, the resistance value of a channel forming region ($r_{ch}$) which does not include the external resistance (r), is calculated by the following formula.

$$r_{ch} = \frac{V}{I_d} \quad (1)$$

$$= (L_g - \Delta L_j) \cdot \left[ \mu \cdot C_{0x} \cdot W \cdot \left( V_g - V_{th} - \frac{V}{2} \right) \right]^{-1}$$

Note that V expresses an external drain voltage (a voltage applied to the drain electrode of the FET), $I_d$ express a current which flows in the FET, $L_g$ and $\Delta L_j$ express a designed length of a channel forming region, and the sum of lengths of diffusions of a source region and a drain region in a horizontal direction, respectively. And $\mu$, $C_{ox}$, and W express a mobility of the FET, a capacitance of the gate insulating film, and a width of the channel forming region, respectively. And $V_g$ and $V_{th}$ express an external gate voltage (a voltage applied to the gate electrode of the FET) and a threshold voltage of the FET.

In addition, a total resistance value ($R_{ch}$) of a current path in the FET is a sum of the resistance values of the channel forming region ($r_{ch}$) and the external resistance (r).

$$R_{ch} = r_{ch} + r \quad (2)$$

As shown by Expression (1), regardless of the external gate voltage ($V_g$), $r_{ch}=0$ at the time of $L_g=\Delta L_j$ due to the absence of an effective channel length. In this condition. $R_{ch}$ is equal to the external resistance (r) as shown in Expression (2). Thus, if $\Delta L_j$ and r do not have dependencies for the external gate voltage, $r_{ch}$–$L_g$ plots for arbitrary gate voltages intersect at one point as shown in FIG. 8A. And $\Delta L_j$ is given by the x-coordinate of the intersection point and r is given by the y-coordinate thereof. However, this method cannot be applied to an FET having an LDD structure, because $r_{ch}$–$L_g$ plots do not intersect at one point as shown in FIG. 8B. Thus, this method cannot be applied to an FET having an LDD structure. This is because the LDD resistance value in the external resistance changes depending on the external gate voltage and a length which is considered as a portion of the channel forming region also changes depending on the external gate voltage. Accordingly, there has been difficulty in estimating an LDD resistance value until now.

There is a method for estimating an LDD resistance value by measuring a sheet resistance of a dedicated TEG (Test Element Group), which is manufactured under the same conditions as the LDD region with respect to the dose amount and the activation method. However, the sheet resistance value obtained by this method is merely a film resistance value and is different from the LDD resistance value of a real FET. The LDD resistance of an FET is a junction resistance and changes depending upon the external gate voltage.

Further, a TEG for measuring a sheet resistance value is extremely large as compared with an LDD region in an FET in order to be accurate by a well-known method. Accordingly, the measured resistance value is the average value in a large region, and it is difficult to evaluate variations of resistance values of LDD regions in each of plural FETS.

SUMMARY OF THE INVENTION

It is an object of the present invention to provide a method for estimating a resistance value of an LDD region that works in an FET and forming an optimum LDD region. Further, the present invention provides an FET in which OFF (leakage) current is reduced and has superior switching characteristics.

One feature of the present invention is that an external resistance value in an FET with an LDD structure is evaluated by assuming a model in which an external resistor is added to a conventional FET, and estimating the resistance value of the external resistor using a relation of a drain current with an external gate voltage and an external drain voltage of the FET.

In the present invention, an equivalent circuit is assumed so as to estimate an external resistance value in an FET with an LDD structure. The equivalent circuit is a circuit in which an additional resistor is serially-connected to a conventional FET. A threshold voltage of the FET with an LDD structure is estimated, and then the external drain voltage—drain current characteristics of the FET with an LDD structure in a state that constant external gate voltage is applied is measured and the external drain voltage—drain current characteristics are applied to the equivalent circuit. Defining an external saturation drain voltage as an external drain voltage when the drain current is saturated, a saturation drain voltage of an imaginary conventional FET, an imaginary FET taking off the external resistor from the estimating FET, is estimated from the threshold voltage and the external saturation drain voltage. The external resistance value is estimated using the external saturation drain voltage, the saturation drain current, and the saturation drain voltage. The resistance value of the LDD region of the FET can be evaluated by the above-mentioned method, since the external resistance value is approximately equal to the resistance value of the LDD region.

The present invention includes a step of estimating a threshold voltage ($V_{th}$) by measuring the characteristics of drain current—external gate voltage of an FET with an LDD structure, a step of estimating an external saturation voltage ($V_{sat}$) and a saturation drain current ($I_{dsat}$) by measuring the characteristics of drain current—external drain voltage, and a step of estimating a saturation drain voltage ($V_{dsat}$) of an imaginary conventional FET, an imaginary FET taking off the external resistor from the estimating FET, using the threshold voltage, and a step of obtaining an external resistance value (r) by a relational expression of $V_{dsat}=V_{sat}-I_{dsat} \times r$ using the external saturation voltage ($V_{sat}$), the saturation drain current ($I_{dsat}$), and the saturation drain voltage ($V_{dsat}$) of the imaginary conventional FET.

According to the present invention, resistance value of an LDD region during actual operation of the FET can be estimated and an optimum LDD region can be formed. Therefore, an FET with a suppressed OFF (leakage) current and superior switching characteristics can be provided.

According to the present invention, local variations of a doping method or an activation ratio can be evaluated, since an external resistance value of a real FET can be evaluated. Conventionally, as the method for evaluating an external resistance value, a method for estimating a source—drain resistance value from the relation of voltage—current between the source and the drain regions is employed. However, the external resistance value has been evaluated only by using a value including a resistance value of a channel forming region by the conventional method. According to the present invention, however, an external resistance value and a resistance value of channel forming region can be evaluated separately.

These and other objects, features and advantages of the present invention become more apparent upon reading of the following detailed description along with the accompanying drawings.

BRIEF DESCRIPTION OF THE DRAWINGS

In the accompanying drawings:

FIG. 7 is a flowchart describing a preferred embodiment of the present invention.

DETAILED DESCRIPTION OF THE INVENTION

Hereinafter, a preferred embodiment of the present invention is described with reference to the figures. FIG. 7 is a flowchart describing one preferred embodiment of the present invention. In the present invention, an equivalent circuit in which an external resistor is serially-connected to the drain side of an FET having a conventional structure is assumed for estimating a resistance value of an LDD region.

At first, the external gate voltage ($V_g$)—drain current ($I_d$) characteristics are measured and the threshold voltage ($V_{th}$) is estimated from the characteristics (a first step). Then, the external drain voltage (V)—drain current ($I_d$) characteristic are measured, and the external saturation drain voltage ($V_{sat}$), which is the external drain voltage when the drain current is saturated, is estimated. (a second step). And the saturation drain voltage ($V_{dsat}$) of an imaginary FET taking off the external resistor from the estimating FET is estimated from the threshold voltage ($V_{th}$). Then the external saturation drain voltage ($V_{sat}$), saturation drain current ($I_{dsat}$), the saturation drain voltage ($V_{dsat}$) are substituted in the theoretical expression to be described below in order to estimate an external resistance value (a third step). The resistance value of LDD regions of the FET can be evaluated by performing the above-mentioned steps since the external resistance value is almost equivalent to the resistance value of the LDD regions.

Figure 1A:
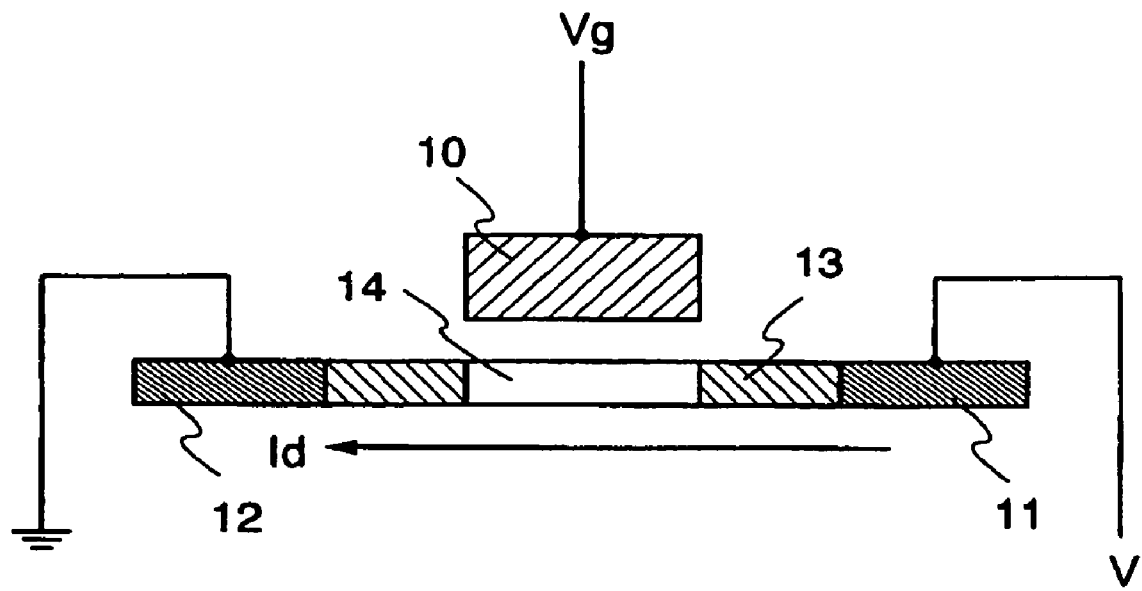
FIGS. 1A and 1B each shows a structure of an FET with LDD regions and an equivalent circuit thereof described in a preferred embodiment of the present invention.

An element shown in FIG. 1A is considered as an FET having an LDD structure. It is an FET that includes a gate electrode 10, a drain region 11, a source region 12, LDD regions 13, and a channel forming region 14. The present invention assumes an equivalent circuit in which an external resistor is serially-connected to the drain side of the FET having a conventional structure for the FET having the above described structure. The equivalent circuit is shown in FIG. 1B.

Figure 1B:
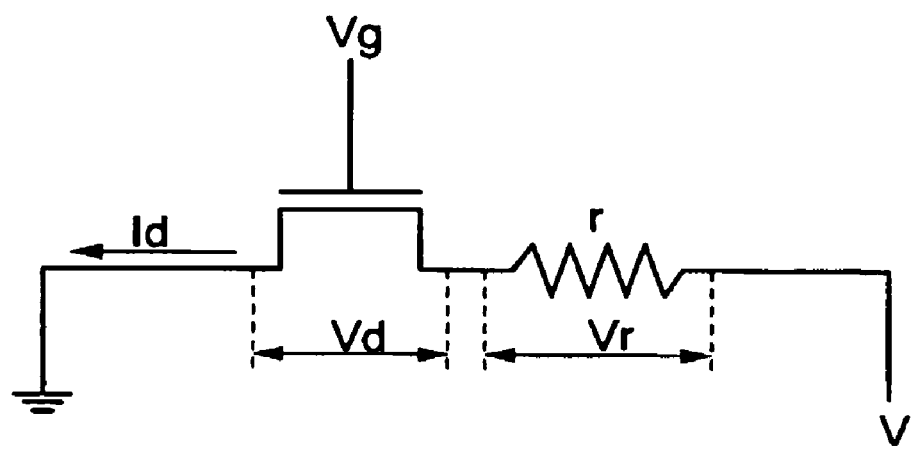

The external drain voltage (V) and the external gate voltage ($V_g$) are applied to the FET and drain current ($I_d$) flows through the FET as shown in FIGS. 1A and 1B.

Voltage $V_r$ and $V_d$ that are applied to the external resistor (r) and an imaginary FET taking off the external resistor from the estimating FET respectively are each shown below.

$$V_r = I_d \cdot r \quad (3)$$

$$V_d = V - V_r \quad (4)$$
$$= V - I_d \cdot r$$

In addition, the drain current in a linear region is given by the following expression employing the gradual channel approximation.

$$I_d = \left(\frac{W}{L}\right) \cdot C_{0x} \cdot \mu \cdot \left\{(V_g - V_{th}) - \frac{V_d}{2}\right\} \cdot V_d \quad (5)$$

Here, W and L express width and length of the channel forming region in the FET, respectively. $C_{ox}$ and $\mu$ express the capacitance of the gate insulating film and the mobility of the FET, respectively. And $V_g$, $V_{th}$ and $V_d$ express an external gate voltage, a threshold voltage of the FET and a drain voltage, respectively.

Next, the drain current ($I_d$) is differentiated with the external drain voltage (V) by using the Expressions (4) and (5) to obtain a conditional expression of a saturation region.

$$\frac{dI_d}{dV} = \frac{dI_d}{dV_d}\frac{dV_d}{dV} \quad (6)$$
$$= \frac{dI_d}{dV_d}\left\{1 - r \cdot \left(\frac{dI_d}{dV}\right)\right\}$$

Since the drain current is saturated when $dI_d/dV=0$, the condition for drain current to be saturated is $dI_d/dV_d=0$ from Expression (6). Then, Expression (5) is differentiated with the drain voltage ($V_d$).

$$\frac{dI_d}{dV_d} = \left(\frac{W}{L}\right) \cdot C_{0x} \cdot \mu \cdot (V_g - V_{th} - V_d) \quad (7)$$

The condition for drain current to be saturated, in other words $dI_d/dV_d=0$, is substituted in Expression (7), the next expression is obtained.

$$V_g - V_{th} - V_d = 0 \quad (8)$$

Thus, the next expression is obtained providing the saturation drain current is $I_{dsat}$, the external drain voltage at the time is $V_{sat}$, and a voltage applying to an imaginary FET taking off the external resistor from the estimating FET is $V_{dsat}$.

$$V_{dsat} - V_{sat} + I_{dsat} \cdot r = 0 \quad (9)$$

$$V_{dsat} = V_g - V_{th} \quad (10)$$

The following expression is obtained from Expressions (9) and (10).

$$V_{sat} = V_g - V_{th} + I_{dsat} \cdot r \quad (11)$$

Expression (9) expresses that the saturation drain voltage ($V_{sat}$) increases by $I_{dsat} \times r$ by adding with an external resistor (r). In addition, it is understood that the additional resistance value (r) has a dependency on the external gate voltage ($V_g$).

Next, by substituting Expression (8) to Expression (5), an expression of saturation drain current ($I_d$) is obtained.

$$I_d = \frac{1}{2}\left(\frac{W}{L}\right) \cdot C_{0x} \cdot \mu \cdot (V_g - V_{th})^2 \quad (12)$$

Expression (12) contains no term concerning an external resistance (r), and is an expression to show the saturation drain current ($I_d$) of a conventional FET without an external resistor. By calculating the square root of both sides of Expression (12), it is clear that the external gate voltage ($V_g$) and the square root of drain current ($I_d$) have a linear characteristic. And the point at which this linear expression intersects a horizontal axis (i.e. $I_d=0$) gives the threshold voltage ($V_{th}$). Therefore, the threshold voltage does not depend on an external resistance (r). Thus, the threshold voltage ($V_{th}$) Is estimated.

Next, the drain current ($I_d$)—external drain voltage (V) curve at an arbitrary gate voltage ($V_g$), which makes the FET pass current in the FET (ON state), is measured. And an external saturation voltage ($V_{sat}$) and a saturation drain current ($I_{dsat}$) when the drain current is saturated are obtained from the curve. Thus, the saturation drain voltage ($V_{dsat}$) of an imaginary FET taking off the external resistor from the estimating FET is determined using Expression (10). When the above-mentioned $V_{sat}$, $I_{dsat}$, and $V_{dsat}$ are substituted in Expression (9), the additional resistance value (r) can be estimated.

The present invention can be applied to both of p-channel and n-channel FETs. In addition, the present invention can be applied to an FET with an active region formed by using a single crystal wafer or an amorphous or polycrystalline semiconductor film that is formed on a glass substrate. Further, the present invention can be also applied to an FET with an active region formed by a compound semiconductor film such as GaAs, InP, SiC, ZnSe, or GaN, or a mixed crystal semiconductor film such as SiGe, or $Al_xGaAs_{1-x}$ in addition to an FET such as using Si or Ge as an active region.

EXAMPLE 1

LDD resistance values of two FETs, whose LDD regions were formed by being doped with different doses of impurities, were evaluated. The active regions of the FETs were manufactured by using a polycrystal formed over a glass substrate. The size of the channel forming regions in the FETs is length (L)/width (W)=10/10 µm, LDD length=1 µm, and the FETs are n-channel type FETs. External resistance values of the two FETs were estimated when the external gate voltage is 5V.

Figure 3:
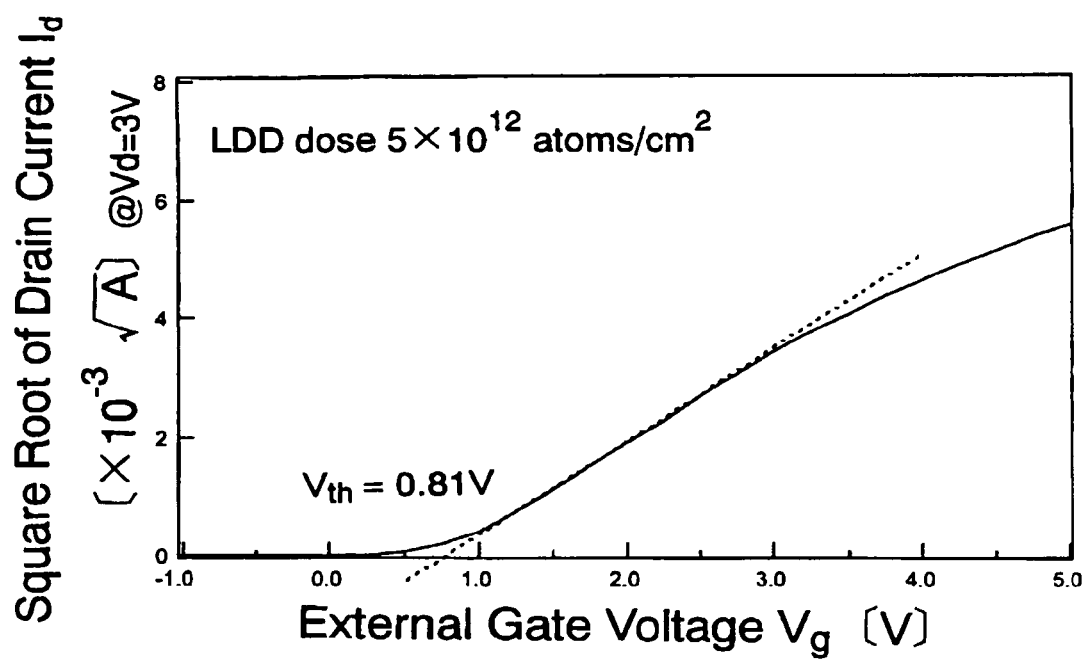
FIG. 3 is a graph showing $I_d$-$V_g$ characteristics of an FET in which an LDD dose is $5 \times 10^{12}$ atoms/cm$^2$.

A drain current ($I_d$)—external gate voltage ($V_g$) curve is measured to estimate the threshold voltage ($V_{th}$) when the external drain voltage is 3V. FIG. 3 shows the drain current ($I_d$)—external gate voltage ($V_g$) curve of an FET in which LDD regions are doped with a dose of $5\times10^{12}$ atoms/cm$^2$. Note that the vertical axis expresses a square root of the drain current ($I_d$). The threshold voltage ($V_{th}$) was estimated by using Expression (10) and FIG. 3, i.e. $V_{th}$=0.81V.

Figure 2:
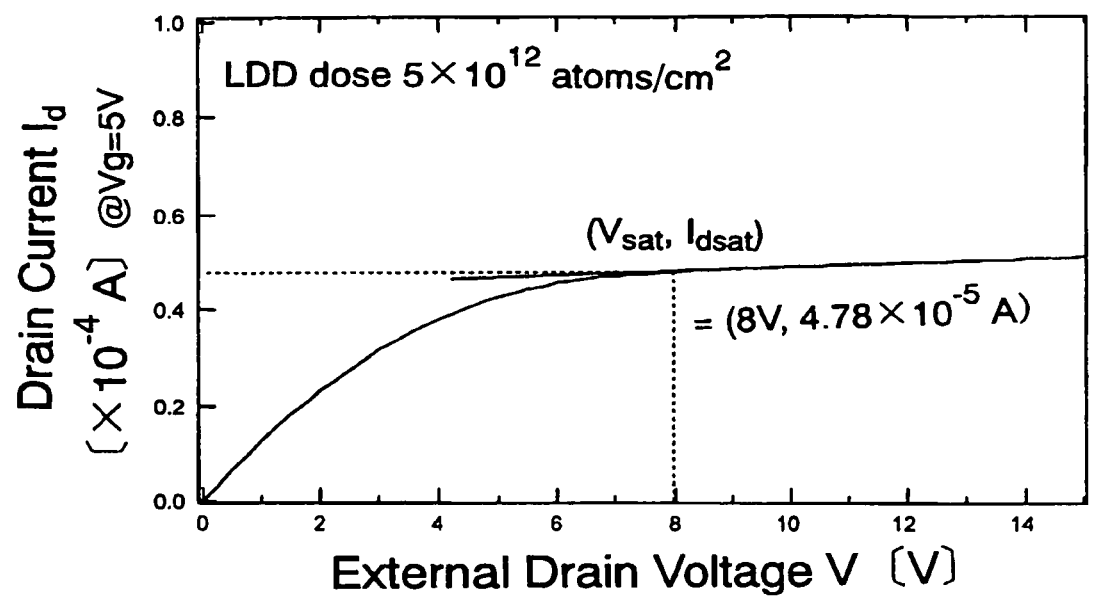
FIG. 2 is a graph showing $I_d$-V characteristics of an FET in which an LDD dose is $5 \times 10^{12}$ atoms/cm$^2$.

FIG. 2 shows a drain current ($I_d$)—external drain voltage (V) curve when the external gate voltage is 5V of an FET in which a dose amount to LDD regions is $5\times10^{12}$ atoms/cm$^2$. The external saturation drain voltage ($V_{sat}$) is defined by the external drain voltage when the drain current becomes constant (saturated). However, even if the external drain voltage exceeds the external saturation drain voltage, the drain current would continue to increase and not be constant in case the electric field of drain edges in the saturation region are strong since avalanche or drain induced barrier lowering phenomenon (DIBL) occurs. In this case, the external saturation drain voltage can be estimated as follows. As shown in FIG. 2, the external drain voltage (V) at the point where the drain current ($I_d$)—external drain voltage (V) curve is separated from a straight line along the saturation region can be assumed as an external saturation drain voltage ($V_{sat}$). And the y-coordinate of the point can be assumed as a saturation drain current ($I_{dsat}$). By using this method, the $V_{sat}$ and the $I_{dsat}$ were estimated, i.e. 8V and 4.78×10$^{-5}$A, respectively. Then a saturation drain voltage ($V_{dsat}$) of an imaginary FET taking off the external resistor from the estimating FET was estimated using Expression (10), $V_{dsat}$=5−0.81=4.19 V. $V_{sat}$, $I_{dsat}$ and $V_{dsat}$ were estimated as mentioned above. A resistance value of the external resistance (r) was calculated by using Expression (9).

$$r = (V_{sat} - V_{dsat})/I_{dsat} \quad (13)$$
$$= (8 - 4.19)/4.78 \times 10^{-5}$$
$$= 7.97 \times 10^4 \text{ (ohm)}$$

Because this value shows a sum of LDD resistance values on both sides of a channel forming region, one-half thereof is an LDD resistance value of one side. When this value is converted to a sheet resistance value ($r_s$), $r_s$=r×(w/2l)= (7.97×10$^4$)×(10/2)=3.99×10$^5$ (Ω/square) was obtained. Here, w and l express the width and the length of the LDD regions, respectively.

Figure 4:
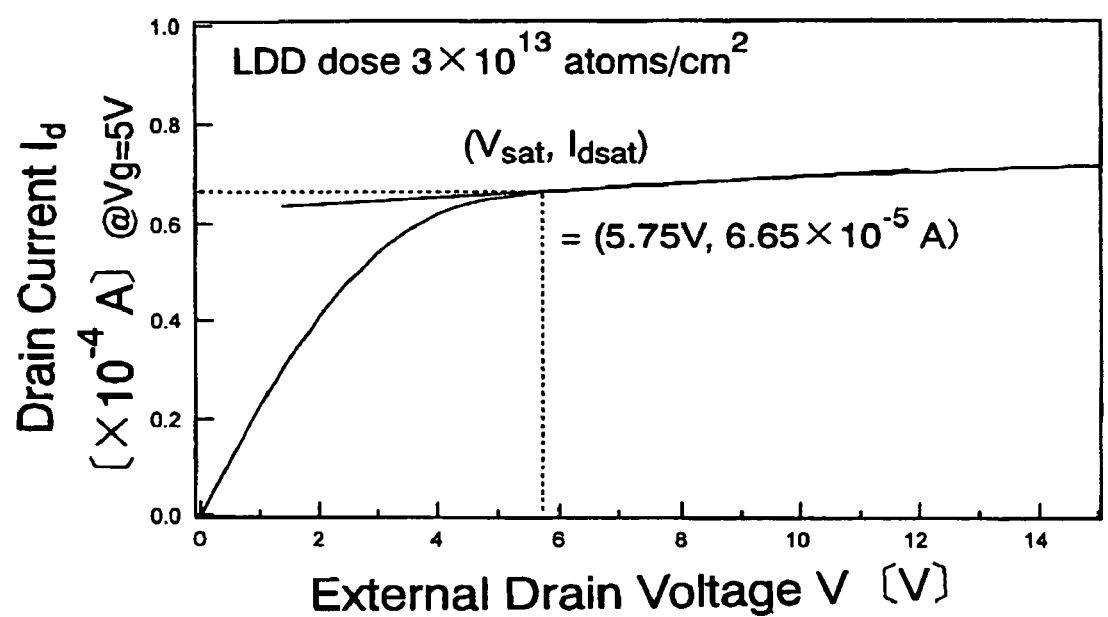
FIG. 4 is a graph showing $I_d$-V characteristics of an FET in which an LDD dose is $3 \times 10^{13}$ atoms/cm$^2$.
Figure 5:
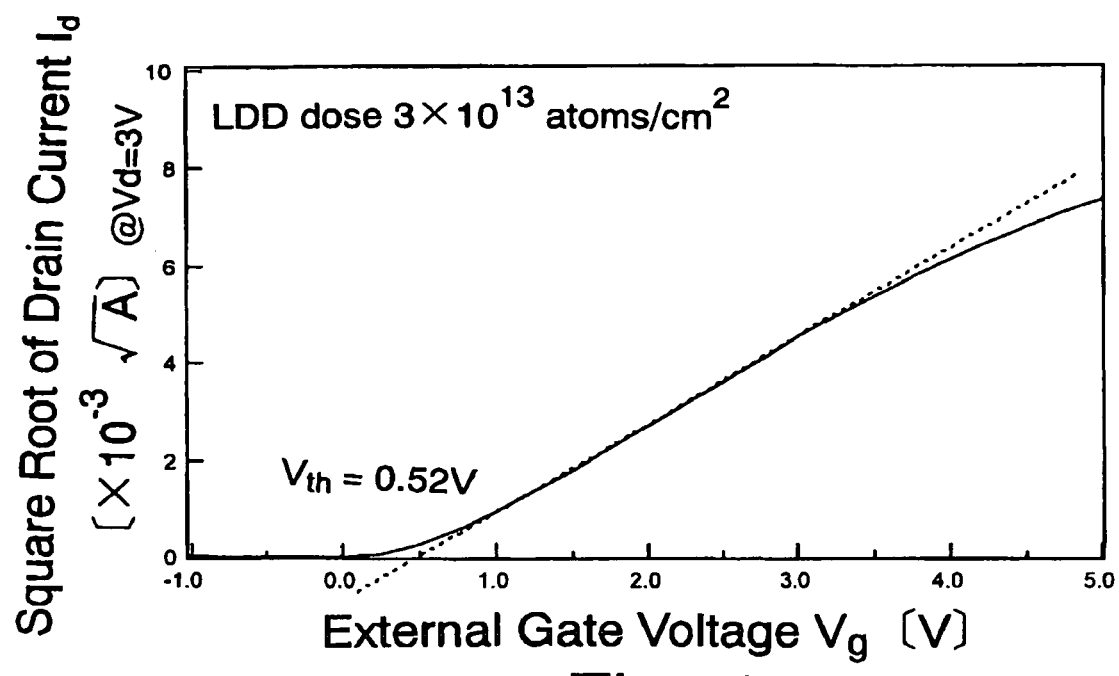
FIG. 5 is a graph showing $I_d$-$V_g$ characteristics of an FET in which an LDD dose is $3 \times 10^{13}$ atoms/cm$^2$.

Similarly, an LDD resistance value of an FET in which LDD regions are doped with a dose of 3×10$^{13}$ atoms/cm$^2$ was estimated. FIG. 5 shows a drain current ($I_d$)—external gate voltage ($V_g$) curve of an FET in which LDD regions are doped with a dose of 3×10$^{13}$ atoms/cm$^2$. Note that the vertical axis denotes a square root of the drain current ($I_d$). When the threshold voltage ($V_{th}$) was to be estimated by using Expression (12) and FIG. 5, $V_{th}$=0.52V was obtained. FIG. 4 shows a drain current ($I_d$)—external drain voltage (V) curve of the FET in which LDD regions are doped with a dose of 3×10$^{13}$ atoms/cm$^2$ when the external gate voltage is 5V. $V_{sat}$ and $I_{dsat}$ were estimated as 5.75V and 6.65×10$^{-5}$A from FIG. 5, respectively.

Thus, a saturation drain voltage ($V_{dsat}$) of an imaginary FET taking off the external resistor from the estimating FET was to be calculated, i.e. $V_{dsat}$=5−0.52=4.48V. Then the external resistance value (r) was estimated as described above, $$r = (V_{sat} - V_{dsat})/I_{dsat} \quad (14)$$
$$= (5.75 - 4.48)/6.65 \times 10^{-5}$$
$$= 1.91 \times 10^4 \text{ (ohm)}$$

When the value was converted to a sheet resistance ($r_s$) $r_s$=r (w/2l)=(1.91×10$^4$) (10/2)=9.55×10$^4$ (Ω/square) was obtained. The results were shown in Table 1.

Next, the external gate voltage dependency of source-drain resistance values and LDD resistance values were estimated using an FET with a size of L/W=4/10 μm and LDD=1 μm. Here, the source-drain resistance value was obtained by dividing the external saturation drain voltage by the saturation drain current estimated from an external drain voltage (V)—drain current ($I_d$) curve, and the LDD resistance value is calculated according to the present invention.

Figure 6:
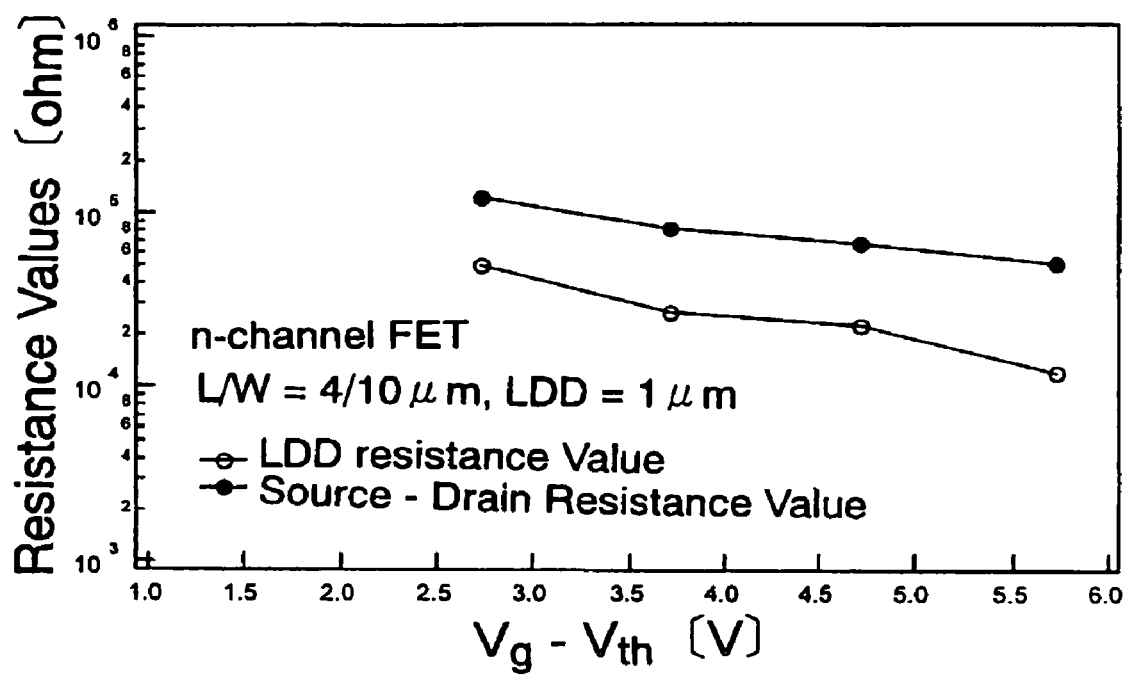
FIG. 6 is a graph showing results of source-drain resistances estimated by dividing saturation voltage with saturation current and LDD resistance values estimated by using the present invention.
Figure 8B:
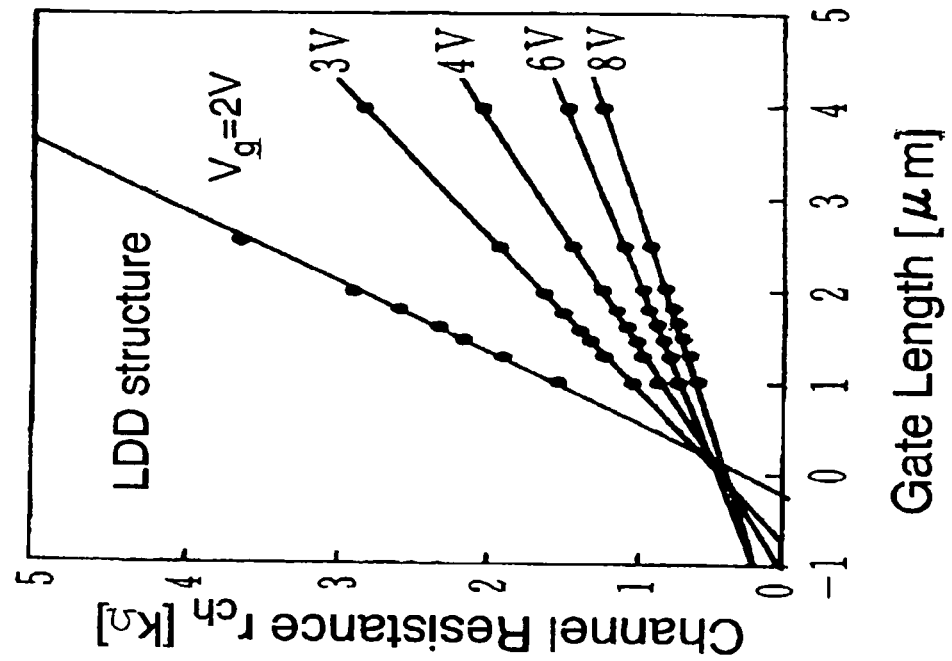
FIG. 8A shows $r_{ch}$-$L_g$ plots of a conventional FET and FIG. 8B shows $r_{ch}$-$L_g$ plots of an FET having an LDD structure.
Figure 8A:
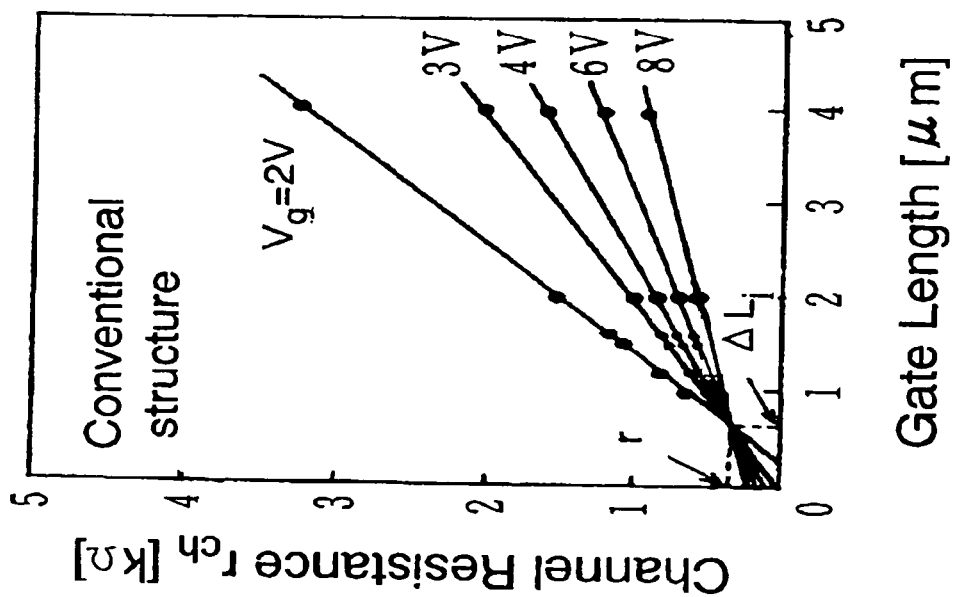

FIG. 6 shows the result. The horizontal axis denotes the saturation drain voltage ($V_{dsat}$) obtained by subtracting the threshold voltage ($V_{th}$) from the external gate voltage ($V_g$). The vertical axis denotes resistance values, a black dot shows source-drain resistance values and a white dot shows LDD resistance values. And the difference of the two resistance values is equivalent to a resistance value of the channel forming region. The external resistance values used to be evaluated was only with a value including the resistance value of channel forming region as shown by the black dot conventionally. However, the external resistance value and the resistance value of the channel forming region can be evaluated independently according to the present invention.

This application is based on Japanese Patent Application serial No. 2003-139674 filed in Japan Patent Office on May 16, 2003, the contents of which are hereby incorporated by reference.

Although the present invention has been fully described by way of Embodiment Mode and Example with reference to the accompanying drawings, it is to be understood that various changes and modifications will be apparent to those skilled in the art. Therefore, unless such changes and modifications depart from the scope of the present invention hereinafter defined, they should be constructed as being included therein.

What is claimed is:

1. An evaluation method of an FET having an LDD structure comprising the steps of:
    estimating a threshold voltage of the FET having the LDD structure;
    measuring external drain voltage—drain current characteristics of the FET having the LDD structure in a state that a constant external gate voltage is applied and estimating an external saturation drain voltage and a saturation drain current;
    applying the external drain voltage—drain current characteristics to an equivalent circuit, in which an external resistor is serially-connected to a drain side of an FET having a conventional structure;
    estimating a saturation drain voltage of the FET having the conventional structure; and
    evaluating an external resistance value using the external saturation drain voltage, the saturation drain current and the saturation drain voltage.

2. The evaluation method of the FET having the LDD structure according to claim 1, wherein the FET having the LDD structure is an MOST.

TABLE 1

|  | dose amount (atoms/cm$^2$) | $V_{th}$(V) | $V_{dsat}$(V) | $I_{dsat}$(A) | $V_{sat}$(V) | r(Ω) | $r_s$ (Ω/square) |
|---|---|---|---|---|---|---|---|
| FET 1 | 5 × 10$^{12}$ | 0.81 | 4.19 | 4.78 × 10$^{-5}$ | 8.00 | 7.97 × 10$^4$ | 3.99 × 10$^5$ |
| FET 2 | 3 × 10$^{13}$ | 0.52 | 4.48 | 6.65 × 10$^{-5}$ | 5.75 | 1.91 × 10$^4$ | 9.55 × 10$^4$ |

3. The evaluation method of the FET having the LDD structure according to claim 1, wherein the FET having the LDD structure is a TFT.

4. An evaluation method of an FET having an LDD structure comprising the steps of:
- estimating a threshold voltage by measuring drain current—external gate voltage characteristics of the FET having the LDD structure,
- estimating an external saturation drain voltage ($V_{sat}$) and saturation drain current ($I_{dsat}$) by measuring drain current—external drain voltage characteristics,
- determining a saturation drain voltage ($V_{dsat}$) using the threshold voltage, and
- estimating an additional resistance value (r) using a relational expression of $V_{dsat}=V_{sat}-I_{dsat}\times r$.

5. The evaluation method of the FET having the LDD structure according to claim 4, wherein the FET having the LDD structure is an MOST.

6. The evaluation method of the FET having the LDD structure according to claim 4, wherein the FET having the LDD structure is a TFT.

* * * * *

UNITED STATES PATENT AND TRADEMARK OFFICE
CERTIFICATE OF CORRECTION

| | | |
|---|---|---|
| PATENT NO. | : 7,060,511 B2 | Page 1 of 1 |
| APPLICATION NO. | : 10/845133 | |
| DATED | : June 13, 2006 | |
| INVENTOR(S) | : Tatsuya Honda | |

It is certified that error appears in the above-identified patent and that said Letters Patent is hereby corrected as shown below:

TITLE PAGE, after "US 2004/0227191 A1 Nov. 18, 2004" and before "(51) Int. Cl.," please insert the following:

(30)   Foreign Application Priority Data

May 16, 2003   (JP)   ……………………………………… 2003-139674

Signed and Sealed this

Twenty-fourth Day of October, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,060,511 B2 | Page 1 of 1 |
| APPLICATION NO. | : 10/845133 | |
| DATED | : June 13, 2006 | |
| INVENTOR(S) | : Tatsuya Honda | |

It is certified that error appears in the above-identified patent and that said Letters Patent is hereby corrected as shown below:

Title Pg, Item (73) Assignee, please replace "Labortory" with --Laboratory--.

Signed and Sealed this

Seventh Day of April, 2009

JOHN DOLL
*Acting Director of the United States Patent and Trademark Office*